United States Patent [19]

Asao et al.

[11] Patent Number: 5,032,528

[45] Date of Patent: Jul. 16, 1991

[54] METHOD OF FORMING A CONTACT HOLE IN SEMICONDUCTOR INTEGRATED CIRCUIT

[75] Inventors: Yoshiaki Asao; Shizuo Sawada, both of Yokohama, Japan

[73] Assignee: Kabushiki Kaisha Toshiba, Kawasaki, Japan

[21] Appl. No.: 538,764

[22] Filed: Jun. 15, 1990

[30] Foreign Application Priority Data

Aug. 10, 1989 [JP] Japan .................................. 1-205671

[51] Int. Cl.[5] .................. H01L 21/265; H01L 21/283
[52] U.S. Cl. ........................................ 437/20; 437/70; 437/186; 437/203
[58] Field of Search .................. 437/20, 50, 186, 203, 437/70, 162, 940

[56] References Cited

FOREIGN PATENT DOCUMENTS 59-4137 10/1984 Japan ..................................... 437/70

Primary Examiner—Olik Chaudhuri
Assistant Examiner—Long Pham
Attorney, Agent, or Firm—Finnegan, Henderson, Farabow, Garrett, and Dunner

[57] ABSTRACT

Regions having different impurity concentrations are formed in the main surface region of the semiconductor substrate. Accordingly, when the substrate is oxidized, oxide films having different thickness are formed. More specifically, the oxide film is formed more deeply on the surface region of the substrate having a high impurity concentration in which ions are injected than on the surface region in which no ions are injected. In the etching step, since the thinner oxide film is removed while the thicker oxide film remains, the surface of the region under the thinner oxide film is exposed, and thus a contact hole is formed. If, in the step of forming a contact hole, a portion of the thinner oxide film is covered by a resist pattern, only the regiion of the oxide film which is not masked by the resist pattern is etched and the substrate surface thereunder is exposed, and thus a contact hole is formed.

13 Claims, 3 Drawing Sheets

METHOD OF FORMING A CONTACT HOLE IN SEMICONDUCTOR INTEGRATED CIRCUIT

BACKGROUND OF THE INVENTION

1. Field of the Invention

This invention relates to a method of manufacturing a semiconductor device, and more specifically to a method of forming a contact hole for connecting conductive layers insulated by an interlayer insulating film.

2. Description of the Related Art

According to conventional methods, a contact hole is formed in a semiconductor device as follows. First, appropriate impurities are injected into the surface region of the silicon substrate at a desired acceleration voltage and concentration, to form a conductive diffusion layer. Then, silicon oxide film is deposited on the substrate, including the diffusion layer, by a CVD (Chemical Vapor Deposition) method, thereby forming an interlayer insulating film. Thereafter, a desired resist pattern is formed on the interlayer insulating film by photolithography. The interlayer insulating film is etched, using the resist pattern as a mask by an RIE (Reactive Ion Etching) method, forming a contact hole through which the diffusion layer is exposed. After removing the resist pattern, a wiring layer made of polysilicon is formed on the interlayer insulating layer, filling the contact hole. Thus, the wiring layer is electrically connected to the diffusion layer through the contact hole.

In the above-mentioned method, when a contact hole is formed, the exposed area of the diffusion layer is defined by the resist pattern serving as a photomask. Hence, the contact hole cannot be smaller than the opening made in the photomask and, since the photomask cannot have an opening of a diameter less than a certain design rule, it is impossible to form a contact hole smaller than this design rule.

SUMMARY OF THE INVENTION

It is therefore an object of the present invention to provide a method of forming a fine contact hole smaller than the minimum design rule of a photomask in order to reduce the wiring area, thereby facilitating the integration of semiconductor elements.

The method of forming a contact hole according to the present invention comprises the steps of: selectively forming an injection blocking film for blocking impurities on a semiconductor substrate of a first conductivity type; forming an impurity region by injecting impurity ions of a second conductivity type into the semiconductor substrate using the injection blocking film as a mask; removing the injection blocking film; forming an oxide film by oxidizing the semiconductor substrate; and forming a contact hole by removing at least a portion of the oxide film which is formed on a region within the semiconductor substrate other than the impurity region.

In this method, since regions having different impurity concentrations are formed in the main surface region of the semiconductor substrate, oxide films having different thickness are formed on the substrate as a result of the oxidation of the substrate. More specifically, the oxide film forms more deeply on the high concentration surface region of the substrate in which ions are injected than on the remaining surface regions in which no ions are injected. Hence, in an etching step to remove a portion of the oxide film, even when the substrate surface under the thinner oxide film is exposed, the surface under the thicker oxide film is not exposed.

In addition, if a mask is formed on a portion of the thinner oxide film, only the region of the thinner oxide film which is not covered by the mask is etched in the oxide film removing step. As a result, only that region of the substrate is exposed. Thus, a fine contact hole can be formed regardless of the design rule of a photomask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Embodiments of the present invention will be described below with reference to the accompanying drawings.

FIGS. 1A to 1E are cross sectional views showing, in sequence, the steps of forming a contact hole in a semiconductor device according to a first embodiment of the present invention.

Figure 1A:
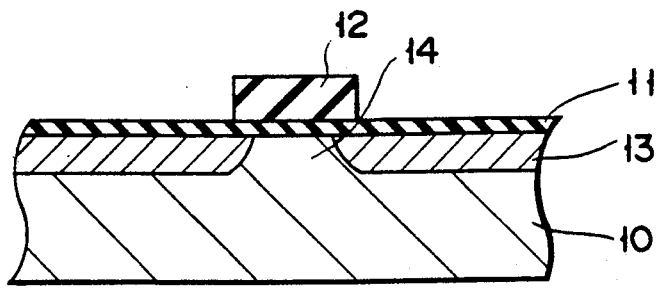
FIGS. 1A to 1E are cross sectional views showing, in sequence, the main steps of the method according to a first embodiment of the present invention.

As shown in FIG. 1A, a p-type silicon substrate 10, having an impurity concentration of about $3 \times 10^{15} cm^{-3}$, is thermal-oxidized, thereby forming a silicon oxide film 11 about 200 Å deep. Photoresist is applied on the silicon oxide film 11, and patterned so that the photoresist remains on the region of the silicon substrate 10 in which a contact hole is to be formed, thereby forming a resist pattern 12. Arsenic ($^{75}As^+$) ions are injected into the silicon substrate 10 at an acceleration voltage of about 50 KeV and a dose of about $3 \times 10^{15} cm^{-2}$. Thus, an N+ region 13, i.e., a diffusion region of a high n-type impurity concentration is formed. A region 14 in the surface region of the silicon substrate 10 under the resist pattern 12 has a lower impurity concentration than in the N+ region 13.

Figure 1B:
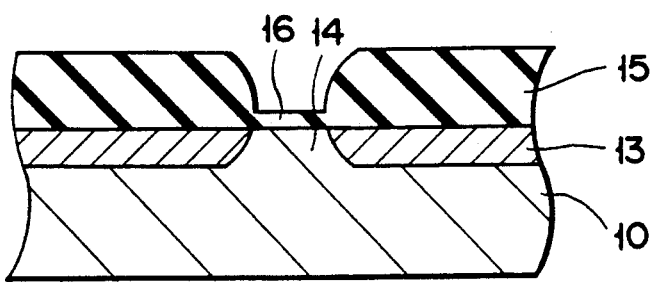

Next, as shown in FIG. 1B, after removing the resist pattern 12 and the silicon oxide film 11, the silicon substrate 10 is thermal-oxidized in 800° C. ambient steam, for example, thus forming a silicon oxide film. In this case, since the impurity concentration in the N+ region 13 differs from that in the region 14 of the surface region of the silicon substrate 10, the rates of the oxidation of the region 13 and the region 14 are different. More specifically, the oxidation rate in the high impurity concentration diffusion region is higher than that in the low impurity concentration diffusion region. Hence, as a result of the oxidation, a thicker silicon oxide film 15 of about 1500 Å thick is formed on the N+ region 13, and a thinner silicon oxide film 16 of about 200 Å thick is formed on the region 14.

Figure 1C:
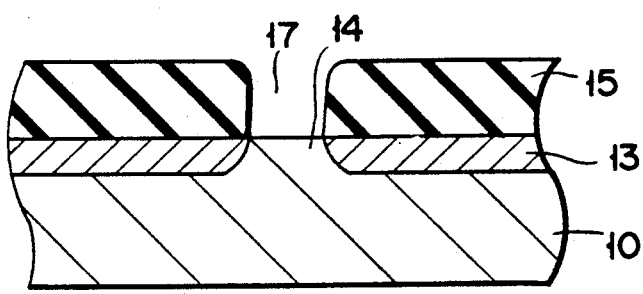

Then, as shown in FIG. 1C, the thinner silicon oxide film 16 is removed by RIE (Reactive Ion Etching). At this time, the silicon oxide film 15, which is much deeper than the silicon oxide film 16, remains deep. As a result, a contact hole 17 is formed.

Figure 1D:
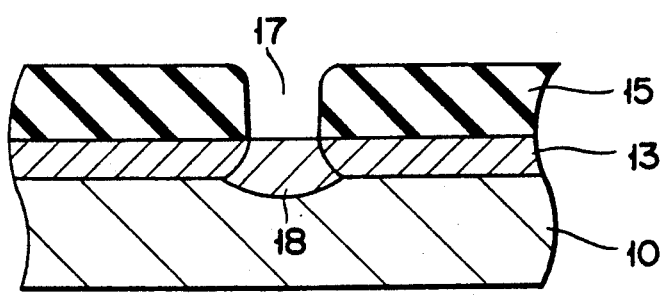

Next, as shown in FIG. 1D, arsenic ($^{75}As^+$) ions are injected into the silicon substrate 10 at an acceleration voltage of about 40 KeV and a dose of about $5 \times 10^{15} cm^{-2}$. Thus, an N+ diffusion region 18 is formed in the surface region 14 of the silicon substrate.

Figure 1E:
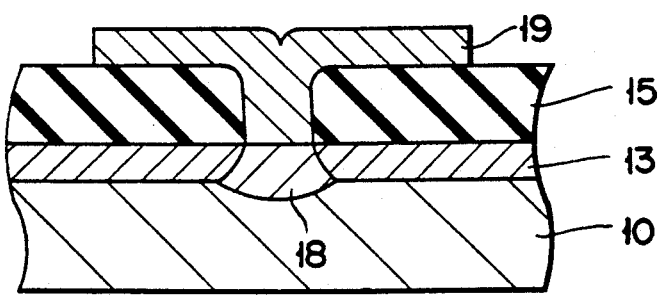

Next, as shown in FIG. 1E, a conductive film made of polysilicon is deposited on the silicon oxide film 15 to a depth of about 1000 Å. The conductive film fills the contact hole 17, and is electrically connected to the N+ diffusion region 18. Thereafter, the conductive film is patterned to a predetermined configuration, thereby forming a wiring layer 19.

In the above-described embodiment, the diameter of the contact hole 17 is defined by the diameter of the region 14 formed under the photoresist 12. More specifically, assuming that the photoresist 12 is patterned minimum design rule, when ions are injected into the silicon substrate 10 using the patterned photoresist 12 as a mask, and thereafter thermal diffused, the N+ diffusion region 13 is extended at the rate of 0.2 μm in the vertical direction per 0.12 μm in the horizontal direction. As a result, the diffusion region is extended to the region 14 of the silicon substrate formed below the photoresist 12. Therefore, the diameter of the region 14 can be smaller than that of the photoresist 12, which is the minimum design rule.

FIGS. 2A to 2E are cross sectional views showing, in sequence, the manufacturing steps of a semiconductor device, according to a second embodiment of the present invention.

Figure 2A:
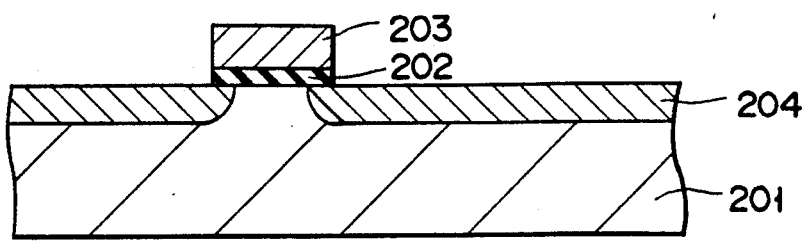
FIGS. 2A to 2E are cross sectional views showing, in sequence, the manufacturing steps of a semiconductor device according to a second embodiment of the present invention.

As shown in FIG. 2A, a silicon oxide film is formed about 200 Å deep on a p-type silicon substrate 201. A polysilicon layer about 400 Å deep is deposited on the silicon oxide film, and thereafter phosphorus ($^{31}P^+$) is thermal-diffused into the silicon substrate in the POCl₃ ambient. Then, a gate oxide film 202 and a gate electrode 203 are patterned by means of photolithography. $^{31}P^+$ ions are injected into the surface region of the silicon substrate 201 using the gate electrode 203 as a mask, at an acceleration voltage of about 40 KeV and a dose of about $2 \times 10^{13} cm^{-2}$. As a result, N⁻ region 204, or an n-type diffusion region of a low impurity concentration, is formed. At this time, the ions are also injected into the gate electrode 203.

Figure 2B:
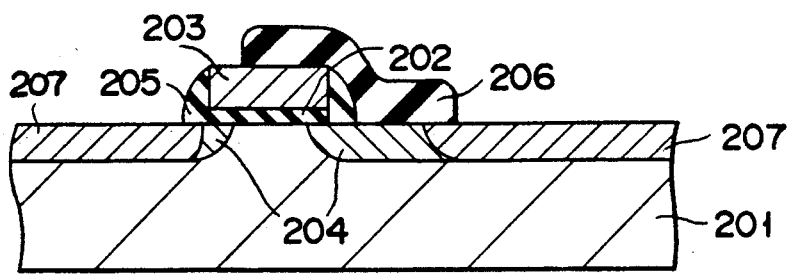

Next, as shown in FIG. 2B, a silicon oxide film is formed about 3000 Å deep on the substrate by means of a CVD method, and thereafter etched by means of the RIE method, thereby forming a silicon oxide film 205 on the side wall of the gate electrode 203. Then, a resist pattern 206 is formed, and $^{75}As^+$ ions are injected into the region 204 using the resist pattern 206, the gate electrode 203 and the silicon oxide film 205 as a mask, at an acceleration voltage of about 50 KeV and a dose of about $3 \times 10^{15} cm^{-2}$. As a result, an N+ region 207 is formed, which serves as an n-type diffusion region of a high impurity concentration in an MOS transistor having an LDD (lightly doped drain) structure.

Figure 2C:
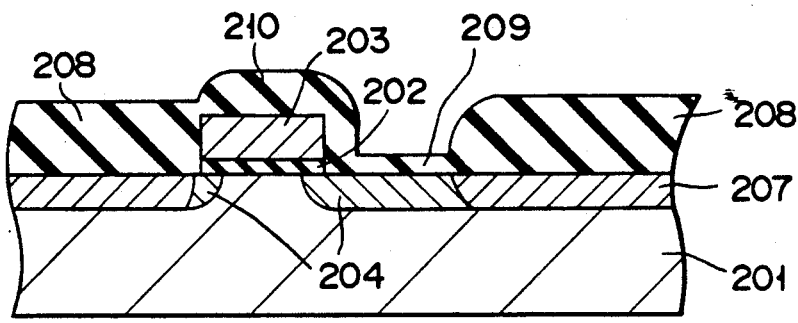

Next, as shown in FIG. 2C, after the resist pattern 206 is removed, thermal-oxidation is performed to form a silicon oxide film. In accordance with the impurity concentrations, a silicon oxide film 208 about 1500 Å deep is formed on the N+ region 207, a silicon oxide film 209 about 200 Å deep on the N⁻ region 204, and a silicon oxide film 210 about 1500 Å deep on the gate electrode 203.

Figure 2D:
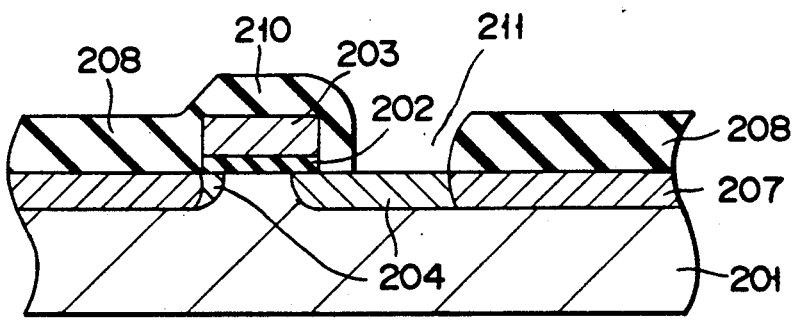

Then, as shown in FIG. 2D, the thinner silicon oxide film 209 is removed by an RIE method. At this time, the silicon oxide film 208 and 210, which are much deeper, maintain their thickness. Thus, a contact hole 211 is formed.

Figure 2E:
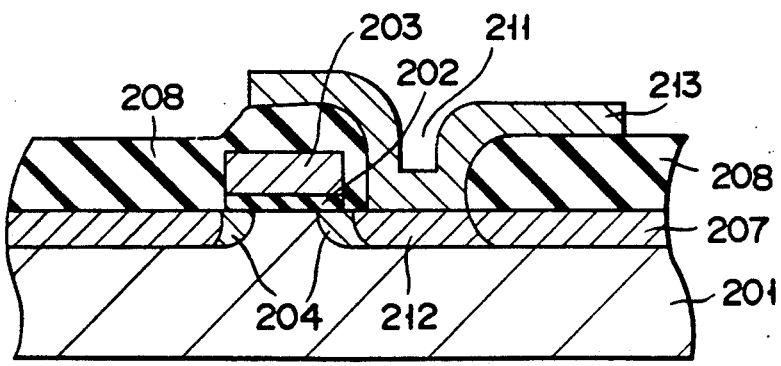

Next, as shown in FIG. 2E, $^{75}As^+$ ions are injected through the contact hole into the region 204 at an acceleration voltage of about 40 KeV and a dose of about $5 \times 10^{15} cm^{-2}$, thereby forming an N+ region 212 within the region 204, the surface of which is exposed via the bottom of the contact hole 211. Thereafter, a conductive layer made of polysilicon is deposited on the substrate by means of a CVD method, so that the contact hole 211 is filled therewith. Then, the conductive layer is patterned to a predetermined configuration, thereby forming a wiring layer 213.

In this embodiment, the diameter of the contact hole 211 is defined substantially by the distance between the end of the gate electrode 203 and the end of the N+ region 207. Hence, the contact hole can be formed in a self-aligning manner. In addition, since the N+ diffusion region 207 is extended toward the region under the resist pattern 206 serving as a mask, as in the first embodiment, it is possible to form the contact hole 211 finer than the resist pattern 206. Further, since the contact hole is formed in a self-aligning manner, the diameter of the resist pattern 206 need not be determined accurately, and the distance between the end of the N+ region 207 and the gate electrode 203 may be determined at a rough estimate. Therefore, mask alignment need not be performed with high accuracy.

FIGS. 3A to 3D are cross sectional views showing, in sequence, the manufacturing steps of a semiconductor device according to a third embodiment of the present invention.

Figure 3A:
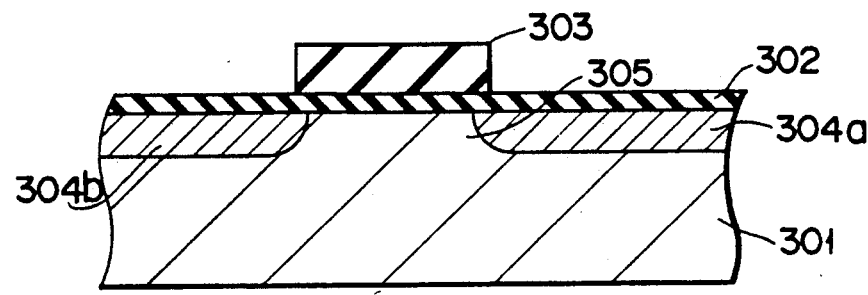
FIGS. 3A to 3D are cross sectional views showing, in sequence, the manufacturing steps of a semiconductor device according to a third embodiment of the present invention.
Figure 3B:
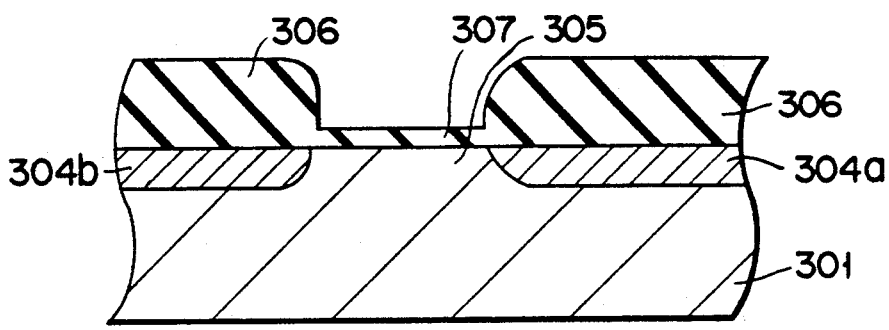

The steps shown in FIGS. 3A and 3B are the same as those shown in FIGS. 1A and 1B. As shown in FIG. 3A, a p-type silicon substrate 301 is thermal-oxidized to form a silicon oxide film 302 about 200 Å deep, and subsequently a resist pattern 303 is formed. $^{75}As^+$ ions are injected into the substrate 301 using the resist pattern 303 as a mask, thereby forming N+ regions 304a and 304b. A region 305 of the surface region of the silicon substrate which is located under the resist pattern 303 has a lower impurity concentration than the N+ regions 304a and 304b. As shown in FIG. 3B, after removing the resist pattern 303 and the silicon oxide film 302, the silicon substrate 301 is thermal-oxidized to form silicon oxide films; thicker silicon oxide films 306 are formed on the N+ diffusion regions 304a and 304b, and a thinner silicon oxide film 307 is formed on the region 305 of the surface region of the silicon substrate.

Figure 3C:
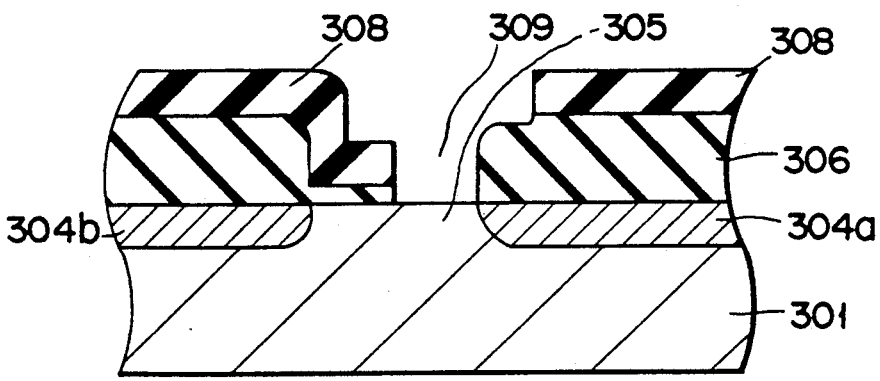

Next, as shown in FIG. 3C, a resist pattern 308, which is minimum design rule, is formed in a staggered manner so as to cover a portion of the thinner silicon oxide film 307. Thereafter the remaining portion of the thinner silicon oxide film 307, i.e., a portion which is not covered by the resist pattern 308, is etched by means of the RIE method. As in the first and second embodiments, even if a portion of the thicker oxide film 306 is not masked by the resist pattern 308, the film 306, including the unmasked portion, remains sufficiently thick. Thus, a contact hole 309 is formed.

Figure 3D:
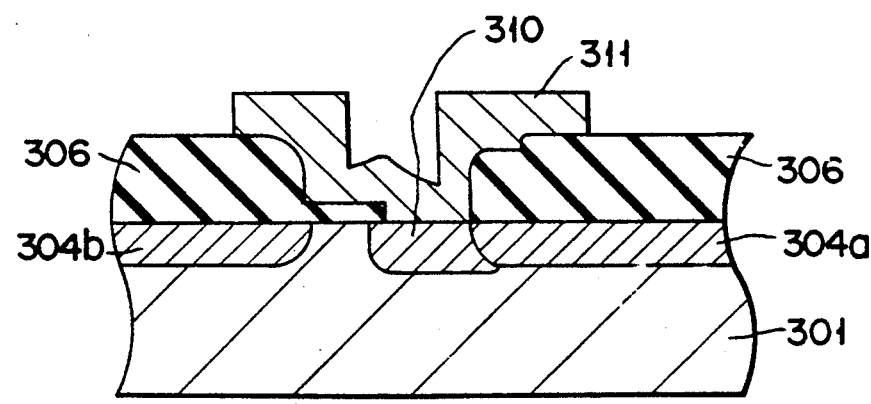

Next, as shown in FIG. 3D, $^{75}As^+$ ions are injected into the region 305 of the surface region of the silicon substrate, thereby forming an N+ region 310 connected to the N+ region 304a. Thereafter, a conductive layer made of polysilicon is deposited and fills the contact hole 309 by means of a CVD method. Then, the conductive layer is patterned to a predetermined configuration to form a wiring layer 311.

According to this embodiment, in order to determine the diameter of the contact hole, it is necessary only to consider to what extent the resist pattern 308 covers a portion of the thinner silicon oxide film 307. Hence, the pattern size need not be determined accurately, and mask alignment need not be performed with high accuracy. In accordance with an area of the portion of the thinner silicon oxide film 307, covered by the resist pattern 308, a finer contact hole can be formed easily.

In this embodiment of FIGS. 3A to 3D, the resist pattern 308 is formed so that the conductive layer is connected to the N+ region 304a. However, the conductive layer may be connected to the N+ region 304b or, alternatively, it may be connected to both the N+ regions 304a and 304b.

In the above-described embodiments, the ion injection to the silicon substrate is performed after forming the contact hole, thereby forming an N+ region, and the conductive layer is formed thereafter. However, the ion injection may be performed after forming the conductive layer so as to obtain the same effect as in the embodiments.

As has been described above, according to the present invention. Since a contact hole is formed in a self-aligning manner, regardless of the design rule of the photomask, a significantly fine contact hole having high reliability is obtained.

Additional advantages and modifications will readily occur to those skilled in the art. Therefore, the invention in its broader aspects is not limited to the specific details, and illustrated examples, shown and described herein. Accordingly, various modifications may be made without departing from the spirit or scope of the general inventive concept as defined by the appended claims and their equivalents.

What is claimed is:

1. A method of forming a contact hole comprising the steps of:
   selectively forming an injection blocking film for blocking impurity injection, on a semiconductor substrate of a first conductivity type;
   forming an impurity region by injecting impurity ions of a second conductivity type into the semiconductor substrate using the injection blocking film as a mask;
   removing the injection blocking film;
   forming an oxide film by oxidizing the semiconductor substrate;
   forming a contact hole by removing at least a portion of the oxide film on the region of the semiconductor substrate other than the impurity region;
   ion-injecting impurities of the second conductivity type into a surface region of the semiconductor substrate which is formed below a bottom of the contact hole; and
   forming a conductive film which fills the contact hole.

2. A method of forming a contact hole according to claim 1, wherein a thin insulating film is formed on the semiconductor substrate, and the injection blocking film is subsequently formed thereon.

3. A method of forming a contact hole according to claim 1, wherein the impurity concentration of the impurity region is so high that the oxide film formed thereon is much deeper than that formed on the region other than the impurity region.

4. A method of forming a contact hole according to claim 1, wherein the oxide film on the region of the semiconductor substrate other than the impurity region is removed by anisotropic etching according to an RIE method in the step of forming a contact hole.

5. A method of forming a contact hole according to claim 1, wherein at least a portion of the oxide film on the region of the semiconductor substrate other than the impurity region is masked by a resist film, and the portion of the oxide film not masked by the resist film is removed by anisotropic etching according to an RIE method in the step of forming a contact hole.

6. A method of forming a contact hole comprising the steps of:
   selectively forming a first injection blocking film for blocking impurity injection, on a semiconductor substrate of a first conductivity type;
   forming a first impurity region by injecting impurity ions of a second conductivity type into the semiconductor substrate using the first injection blocking film as a mask;
   forming a second injection blocking film covering a portion of the first impurity region;
   forming a second impurity region by injecting impurity ions of a second conductivity type into the first impurity region using the first and second injection blocking films as masks;
   removing the second injection blocking film;
   forming an oxide film by oxidizing the semiconductor substrate;
   forming a contact hole by removing at least a portion of the oxide film formed on the first impurity region on the semiconductor;
   ion-injecting impurities of the second conductivity type into a surface region of the semiconductor substrate which is formed below the contact hole; and
   forming a conductive film which fills the contact hole.

7. A method of forming a contact hole according to claim 6, wherein a thin insulating film is formed on the semiconductor substrate, and the first injection blocking film is subsequently formed thereon.

8. A method of forming a contact hole according to claim 6, wherein impurities of the second conductivity type are injected into the first injection blocking film in the step of forming a first impurity region.

9. A method of forming a contact hole according to claim 6, wherein the second injection blocking film is formed so as to remain on the side walls of the first injection blocking film.

10. A method of forming a contact hole according to claim 6, wherein a region of the first impurity region which is in the vicinity of the first injection blocking film is masked in the step of forming the second impurity region.

11. A method of forming a contact hole according to claim 6, wherein the impurity concentrations of the first injection blocking film and the second impurity region are so high that the oxide films formed thereon are much deeper than that formed on the first impurity region.

12. A method of forming a contact hole according to claim 6, wherein the oxide film on the first impurity region is removed by anisotropic etching according to an RIE method in the step of forming a contact hole.

13. A method of forming a contact hole according to claim 6, wherein at least a portion of the oxide film on the first impurity region is masked by a resist film, and the portion of the oxide film not masked by the resist film is removed by anisotropic etching according to an RIE method, in the step of forming a contact hole.

* * * * *